US012611745B2

(12) United States Patent
Haremaki et al.

(10) Patent No.: US 12,611,745 B2
(45) Date of Patent: Apr. 28, 2026

(54) INDEXING PROCESSING MACHINE

(71) Applicant: SUGINO MACHINE LIMITED,
Namerikawa City (JP)

(72) Inventors: Hiroki Haremaki, Namerikawa City
(JP); Masanori Nakagawa,
Namerikawa City (JP); Kazuo Kimura,
Namerikawa City (JP)

(73) Assignee: SUGINO MACHINE LIMITED,
Namerikawa City (JP)

( * ) Notice: Subject to any disclaimer, the term of this
patent is extended or adjusted under 35
U.S.C. 154(b) by 499 days.

(21) Appl. No.: 18/356,671

(22) Filed: Jul. 21, 2023

(65) Prior Publication Data

US 2024/0042564 A1 Feb. 8, 2024

(30) Foreign Application Priority Data

Aug. 3, 2022 (JP) ................................. 2022-123875

(51) Int. Cl.
*B23Q 16/02* (2006.01)
*H05K 3/00* (2006.01)
(52) U.S. Cl.
CPC ......... *B23Q 16/022* (2013.01); *H05K 3/0047*
(2013.01)
(58) Field of Classification Search
CPC ...... B23Q 16/022; B23Q 16/02; B23Q 1/626;
B23Q 39/023; B23Q 39/026; B23Q
39/044; B23Q 39/042; B23Q 39/04;
B23Q 2220/004; H05K 3/0047; H05K
3/0044
See application file for complete search history.

(56) References Cited

U.S. PATENT DOCUMENTS

2021/0060666 A1* 3/2021 Jeong .................... B23B 39/161

FOREIGN PATENT DOCUMENTS

| DE | 20118456 U1 * | 1/2002 | ............. B23Q 39/04 |
| EP | 0908269 A2 * | 4/1999 | ............. B23Q 7/02 |
| EP | 1188511 A2 * | 3/2002 | ............. B23Q 1/015 |
| JP | 61038834 A * | 2/1986 | |
| JP | S61-038834 A | 2/1986 | |
| JP | 2005525245 A * | 8/2005 | ............. B23Q 1/66 |

OTHER PUBLICATIONS

Hoppe et al.; EP 1188511 A2; Machine Tool With a Motor Driven
Tool Slide; Mar. 20, 2002 (Year: 2002).*
Extended European Search Report mailed on Dec. 8, 2023 in a
corresponding European Patent Application No. 23181789.1 (9
pages).

* cited by examiner

*Primary Examiner* — Bayan Salone
(74) *Attorney, Agent, or Firm* — United IP Counselors,
LLC

(57) ABSTRACT

Provided is an indexing processing machine, including: an
index table having a rotation center, a workpiece being
attachable to the index table at multiple index positions; and
one or more processing machines selected from the group of
a front processing machine, a top processing machine, and
a side processing machine, the one or more processing
machines disposed at least two of the multiple index posi-
tions.

20 Claims, 10 Drawing Sheets

UP

REAR

INDEXING PROCESSING MACHINE

CROSS-REFERENCE TO RELATED APPLICATIONS

This application claims the benefit of priority to Japanese Patent Application No. 2022-123875, filed on Aug. 3, 2022, the entire contents of which are hereby incorporated by reference.

BACKGROUND

1. Technical Field

The present invention relates to an indexing processing machine.

2. Description of the Background

A drilling machine for a printed wiring board having a plurality of drilling stations is known (for example, JP2005-525245 A; hereinafter, Patent Literature 1). The drilling machine has a plurality of drilling working units, in which each working station is assembled side by side in a row to be relatively adjustable to each other in a first direction, and a unique table, which is adjustable in a second direction.

BRIEF SUMMARY

When a large number of holes are simultaneously processed by the drilling machine of Patent Literature 1, an installation area of at least twice as large as that of the table is required for each station. The table is larger than the area of the workpiece. Thus, as the workpiece size is larger and the number of simultaneous machining axes increases, the installation area becomes larger.

An object of the present invention is to provide a multi-axis indexing processing machine having a small installation area, high versatility, and capable of shortening a cycle time.

A first aspect of the present invention provides an indexing processing machine, including:

an index table having a rotation center, a workpiece being attachable to the index table at multiple index positions; and one or more processing machines selected from the group of a front processing machine, a top processing machine, and a side processing machine, the one or more processing machines disposed at least two of the multiple index positions, the front processing machine disposed at a front as viewed from the rotation center toward the multiple index positions, the front processing machine including, a left and right pair of front vertical guides, a first front beam disposed between the pair of the front vertical guides in a vertically movable manner, a pair of first front lateral guides disposed on the first front beam, and a first front unit processing machine including, a first front unit body disposed on the pair of the first front lateral guides in a laterally movable manner, and a first front spindle to which a tip tool is attachable, the first front spindle disposed on the first front unit body in an axially reciprocable manner, the top processing machine disposed above the workpiece as viewed from the rotation center toward the multiple index positions, the top processing machine including, a left and right pair of top front-rear guides extending in a front-rear direction, a top beam extending across the pair of the top front-rear guides in a movable manner in the front-rear direction, a pair of top lateral guides disposed on the top beam, and a first top unit processing machine including, a first top unit body disposed on the top lateral guide in a laterally movable manner, and a first top spindle to which the tip tool is attachable, the first top spindle disposed on the first top unit body in an axially reciprocable manner, the side processing machine disposed at a side of the workpiece as viewed from the rotation center toward the multiple index positions, the side processing machine including, an upper and lower pair of side front-rear guides extending in the front-rear direction, a moving column having both ends supported with the pair of the side front-rear guides in a movable manner in the front-rear direction, a pair of side vertical guides disposed on the moving column, and a first side unit processing machine including, a first side unit body disposed on the pair of the side vertical guides in a vertically movable manner, and a first side spindle to which the tip tool is attachable, the first side spindle disposed on the first side unit body in an axially reciprocable manner.

The index table has, for example, 3 to 8 index positions. One or more of a front processing machine, a side processing machine, and a top processing machine are disposed at a plurality of index positions other than the index position at which the workpiece is loaded or unloaded.

A jig block may be disposed on the index table. Preferably, the jig block has the same number of workpiece attachment surfaces as the index number of the index table. Each workpiece attachment surface is positioned at front when viewed from the index position toward the rotation center of the index table. The workpiece is fixed to the workpiece attachment surface of the jig block.

The front spindle is disposed toward the workpiece. The front spindle is disposed in the front direction. Preferably, the front spindle extends in the front-rear direction from the rotation center of the index table toward the index position. A line from the rotation center of the index table toward the index position is referred to as a reference line. Preferably, the front spindle is parallel to the reference line. Further, the front spindle extends horizontally. The front beam extends perpendicular to the reference line. The front beam extends horizontally.

The front processing machine may be disposed to be inclined from the reference line. For example, in a plan view, the front beam may be inclined from the reference line. At this time, the front spindle may be orthogonal to the front beam arranged in an inclined manner.

The front beam may be arranged orthogonally to the reference line and the front spindle may be inclined from the reference line.

The second front unit processing machine may be disposed below the first front beam. The fourth front unit processing machine may be arranged above the second front beam.

Preferably, the first front lateral moving side feeding device is disposed on the right side of the first front unit body. The second front lateral moving side feeding device is disposed on the left side of the second front unit body.

Preferably, the third front lateral moving side feeding device is disposed on the right side of the third front unit body. The fourth front lateral moving side feeding device is disposed on the left side of the fourth front unit body.

The front processing machine may include a front vertical fixed side feeding device disposed on the support column, a first front vertical moving side feeding device disposed on the first front beam, the first front vertical moving side feeding device configured to move integrally with the first front beam in association with the front vertical fixed side feeding device, and a second front vertical moving side feeding device disposed on the second beam, the second front vertical moving side feeding device configured to move integrally with the second front beam in association with the front vertical fixed side feeding device.

The front processing machine may include a first front cable protection tube including, a first fixed end disposed in the middle of the first front beam, and a first moving end disposed on the first front unit body, the first front cable protection tube extending rightward from the first fixed end and being folded back in a U-shape to be connected to the first moving end, and a second front cable protection tube including, a second fixed end disposed in the middle of the first front beam, and a second moving end disposed on the second front unit body, the second front cable protection tube extending leftward from the second fixed end and being folded back in a U-shape to be connected to the second moving end.

The front processing machine may include a third front cable protection tube including, a third fixed end disposed in the middle of the second beam, and a third moving end disposed on the third front unit body, the third front cable protection tube extending rightward from the third fixed end and being folded back in a U-shape to be connected to the third moving end, and a fourth front cable protection tube including, a fourth fixed end disposed in the middle of the second beam, and a fourth moving end disposed on the fourth front unit body, the fourth front cable protection tube extending leftward from the fourth fixed end and being folded back in a U-shape to be connected to the fourth moving end.

Preferably, the top beam is arranged perpendicular to the reference line. At this time, the top beam is parallel to the front beam. The top beam is arranged horizontally.

The top processing machine may be disposed to be inclined with respect to the reference line. For example, in a plan view, the top beam may be disposed to be inclined with the reference line.

Preferably, the top spindle extends vertically. The top spindle may be inclined with respect to a vertical direction.

The top front-rear guide is disposed on the frame. The frame may include, for example, a top fixed beam extending in a front-rear direction. The top front-rear guide may be disposed on the top fixed beam.

The top processing machine may further includes a first top cable protection tube including, a first fixed end disposed in the middle of the top beam, and a first moving end disposed on the first top unit processing machine, the first top cable protection tube extending rightward from the first fixed end and being folded back in a U-shape to be connected to the first moving end, and a second top cable protection tube including, a second fixed end disposed in the middle of the top beam, and a second moving end disposed on the second top unit processing machine, the second top cable protection tube extending leftward from the second fixed end and being folded back in a U-shape to be connected to the second moving end.

The side processing machine may be disposed to be inclined with respect to the reference line passing through the rotation center. For example, in a plan view, the moving column may be disposed to be inclined with respect to the reference line. In the side unit processing machine, the side spindle may be disposed to be inclined from the lateral direction.

The side front-rear guide is disposed on the frame. The frame may have, for example, a side beam extending in the front-rear direction. The side front-rear guide and the side rail side moving device may be disposed on the side beam.

When the first side processing machine is disposed at the right side of the first index position as viewed from the rotation center of the index table toward the index position, the first side processing machine is disposed so as not to interfere with the side processing machine and the front processing machine disposed at the right adjacent to the first index position.

Further, when the second side processing machine is disposed at the left side of the first index position as viewed from the rotation center of the index table toward the index position, the second side processing machine is disposed so as not to interfere with the side processing machine and the front processing machine disposed at the left adjacent to the first index position.

For example, the side processing machine is installed at index positions skipping one index position among a plurality of index positions.

The side spindle is disposed toward the workpiece. Preferably, the side spindle extends in a lateral direction as viewed from the rotation center of the index table toward the index position. The side spindle may be inclined with the lateral direction.

In a plan view, the moving columns may be arranged to be inclined. For example, the moving column may extend vertically, and the side vertical guide may be inclined with respect to the reference line passing through the rotation center in a plan view.

The side processing machine may further include:

a first side cable protection tube including, a first fixed end disposed in the middle of the moving column, and a first moving end disposed on the first side unit processing machine, the first side cable protection tube extending downward from the first fixed end and being folded back in a U-shape to be connected to the first moving end, and a second side cable protection tube including, a second fixed end disposed in the middle of the moving column, and a second moving end disposed on the second side unit processing machine, the second side cable protection tube extending upward from the second fixed end and being folded back in a U-shape to be connected to the second moving end.

The side processing machine may include a first side processing machine disposed on one of the right side and the left side as viewed from the rotation center of the index table toward the index position, and a second side processing machine disposed on the other side.

The second side processing machine is substantially the same as the first side processing machine.

Preferably, the first top moving side feeding device is disposed on the right side of the first top unit body. The second top moving side feeding device is disposed on the left side of the second top unit body.

Preferably, the first side vertical moving side feeding device is disposed below the first side unit body. The second side vertical moving side feeding device is disposed above the second side unit body.

The front lateral fixed side feeding device and the front lateral moving side feeding device, the top lateral fixed side feeding device and the top lateral moving side feeding device, or the side vertical fixed side feeding device and the side vertical moving side feeding device are, for example, a rack and a pinion, or a fixed ball screw shaft and a rotary ball nut.

The indexing processing machine according to the present invention has a small installation area, high versatility, and can shorten the cycle time.

DETAILED DESCRIPTION

Figure 1:
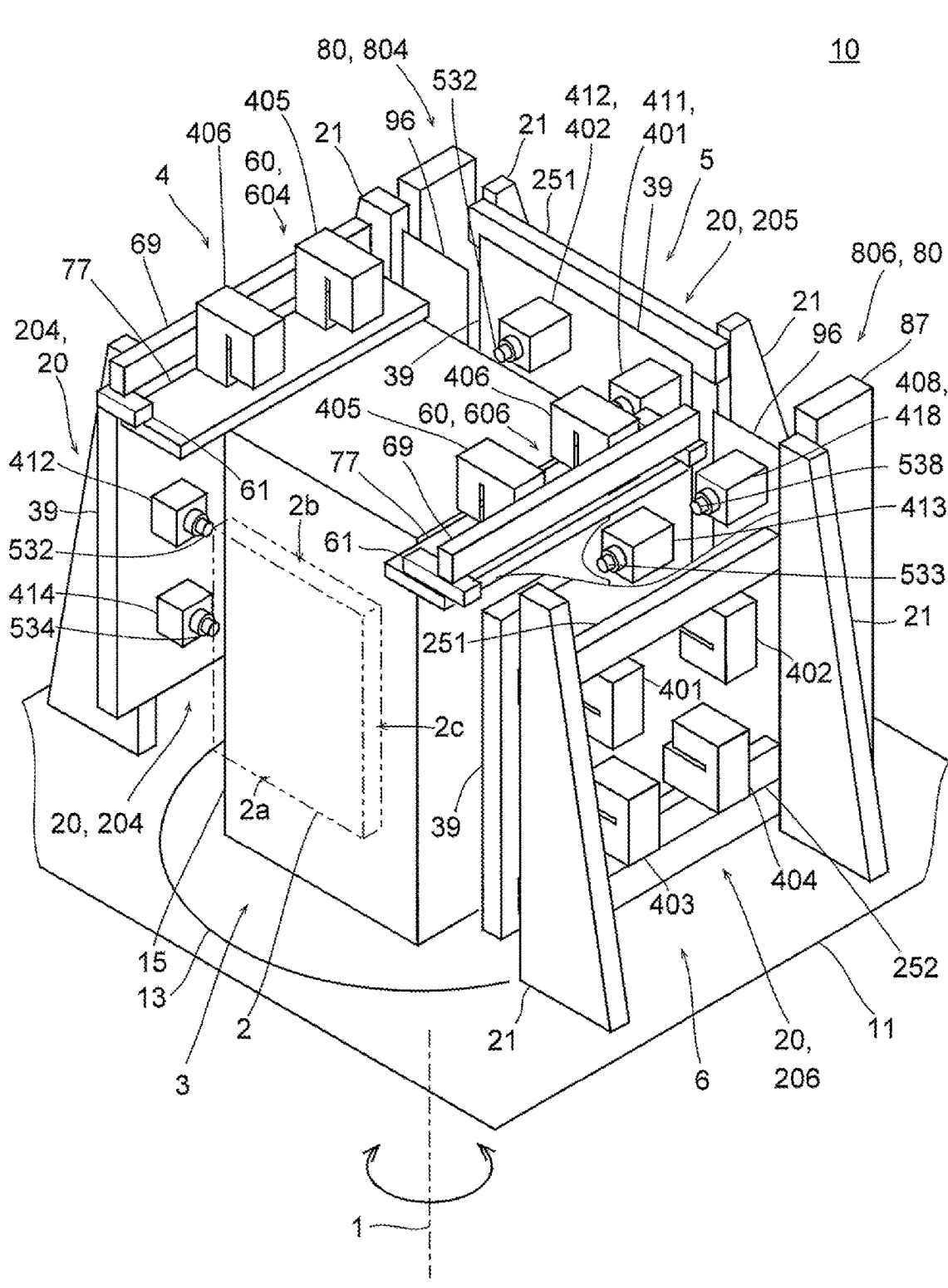
FIG. 1 is a perspective view of an indexing processing machine according to an embodiment.
Figure 2:
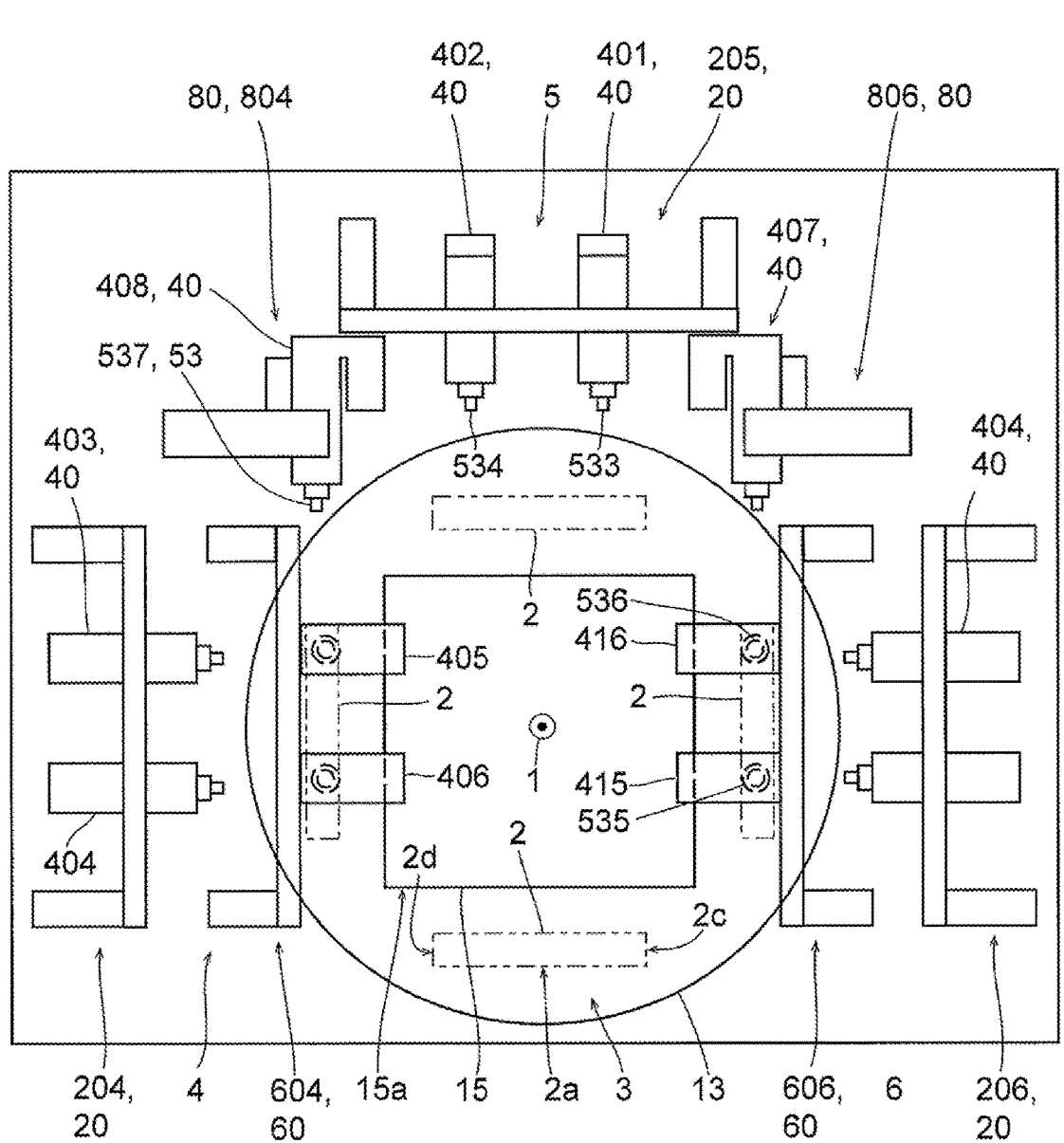
FIG. 2 is a plan view of the indexing processing machine according to the embodiment.

As shown in FIGS. 1 and 2, the indexing processing machine 10 according to the present embodiment includes a plurality of processing machines selected from an index table 13, a front processing machine 20 (front processing machines 204 to 206), a top processing machine 60 (top processing machines 604, 606), and a side processing machine 80 (side processing machines 804, 806).

The indexing processing machine 10 may include a frame 11 and a jig block 15. The index table 13 has a plurality of (four in FIG. 1) index positions 3, 4, 5, and 6. In the present embodiment, the index table 13 is rotated about the rotation center 1 by 90 degrees to be indexed. For example, the index position 3 is a loading and unloading position. The index positions 4, 5, and 6 are processing positions.

At the index positions 4 to 6, which are processing positions, one or more processing machines among the front processing machine 20, the top processing machine 60, and the side processing machine 80 are arranged. For example, the front processing machine 204, the top processing machine 604, and the side processing machine 804 are arranged at the index position 4. The front processing machine 205 is arranged at the index position 5. The front processing machine 206, the top processing machine 606, and the side processing machine 806 are arranged at the index position 6. Some of the index positions may be an idle position without a processing machine. Hereinafter, the direction when viewed from the rotation center 1 toward the respective index positions is referred to as front, side, left and right, front and rear.

The front processing machine 20, which is disposed at the front, includes front unit processing machines 401 to 404. The front unit processing machines 401 to 404 have front unit bodies 411 to 414 and front spindles 531 to 534, respectively. Each front spindles 531 to 534 extends toward the jig block 15. For example, each of the front spindles 531 to 534 extends in the front-rear direction. The front processing machine 20 may have a front cover 39.

The top processing machine 60 is disposed above a workpiece 2 located at the index position. The top processing machine 60 has top unit processing machines 405, 406. The top unit processing machines 405, 406 have top unit bodies 415, 416 and top spindles 535, 536, respectively. Each top spindle 535, 536 extends toward the workpiece 2. For example, the top spindles 535, 536 extend vertically. The top processing machine 60 may have a top cover 77.

The side processing machine 80 is disposed on the lateral side of the workpiece 2 located at the index positions 4, 6. The side processing machine 80 includes side unit processing machines 407, 408. The side unit processing machines 407, 408 have side unit bodies 417, 418 and side spindles 537, 538, respectively. Each side spindle 537, 538 extends toward the workpiece 2. For example, when viewed from the rotation center 1 toward the index position, the side spindles 537 538 extend laterally. The side processing machine 80 may have a side cover 96.

The jig block 15 has four workpiece attachment surfaces 15a on the periphery thereof. The workpiece attachment surfaces 15a face the index positions 3 to 6, respectively. The workpieces 2 are attached to the workpiece attachment surfaces 15a, respectively. The workpiece 2 has a front surface 2a, a top surface 2b, a right side surface 2c, and a left side surface 2d.

Figure 3:
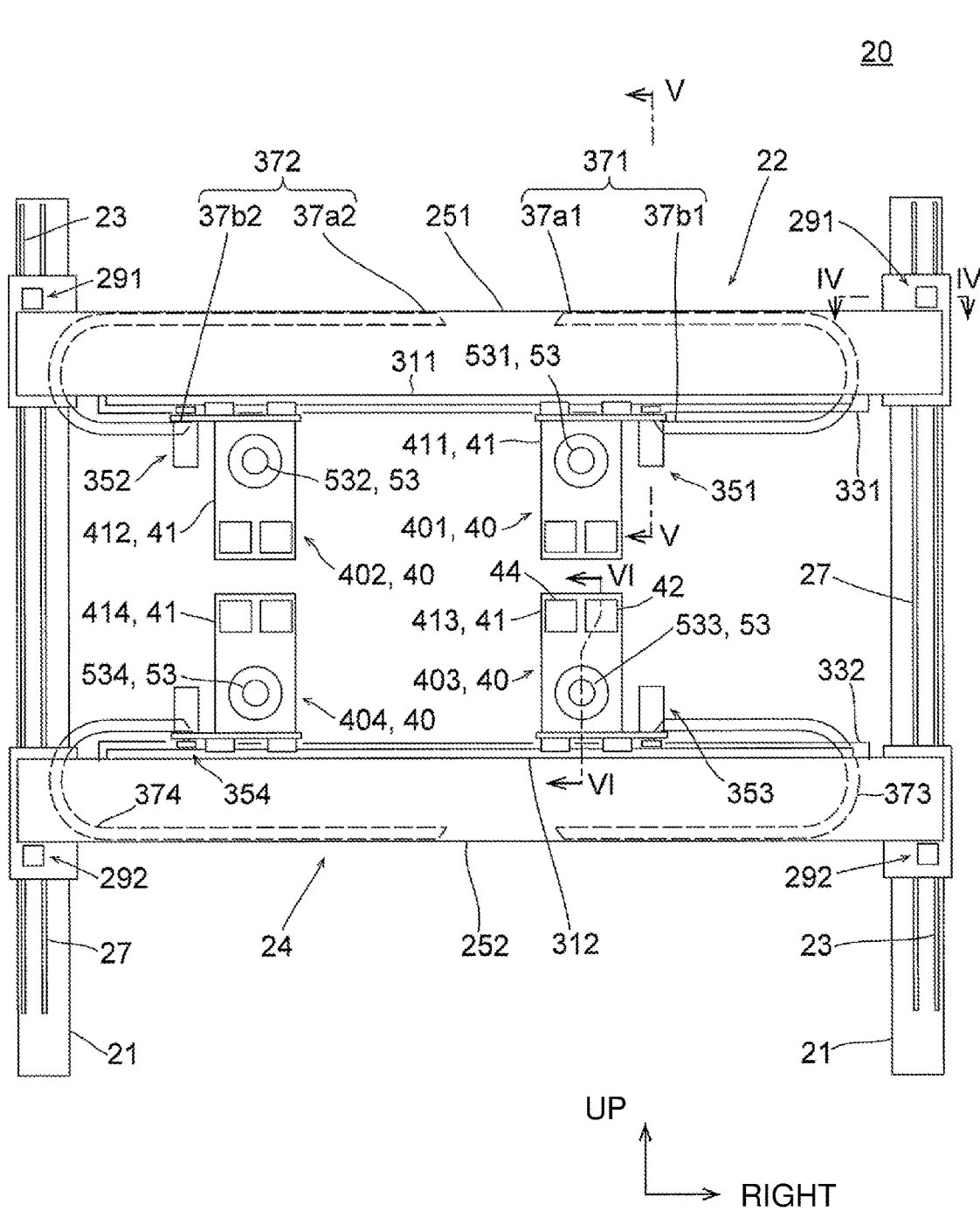
FIG. 3 is a front view of the front indexing processing machine according to the embodiment.

As shown in FIG. 3, the front processing machine 20 includes a pair of support columns 21, a pair of front vertical guides 23, a front vertical rack (front vertical fixed side feeding device) 27, a first front processing machine group 22, and a second front processing machine group 24.

The first front processing machine group 22 includes a first front beam 251, a first front vertical moving side feeding device 291, a pair of first front lateral guides 311, a first front unit processing machine 401, a first front lateral rack (first front lateral fixed side feeding device) 331, a second front unit processing machine 402, a first front lateral moving side feeding device 351, a second front lateral moving side feeding device 352, a first front cable protection tube 371, and a second front cable protection tube 372.

Figure 4:
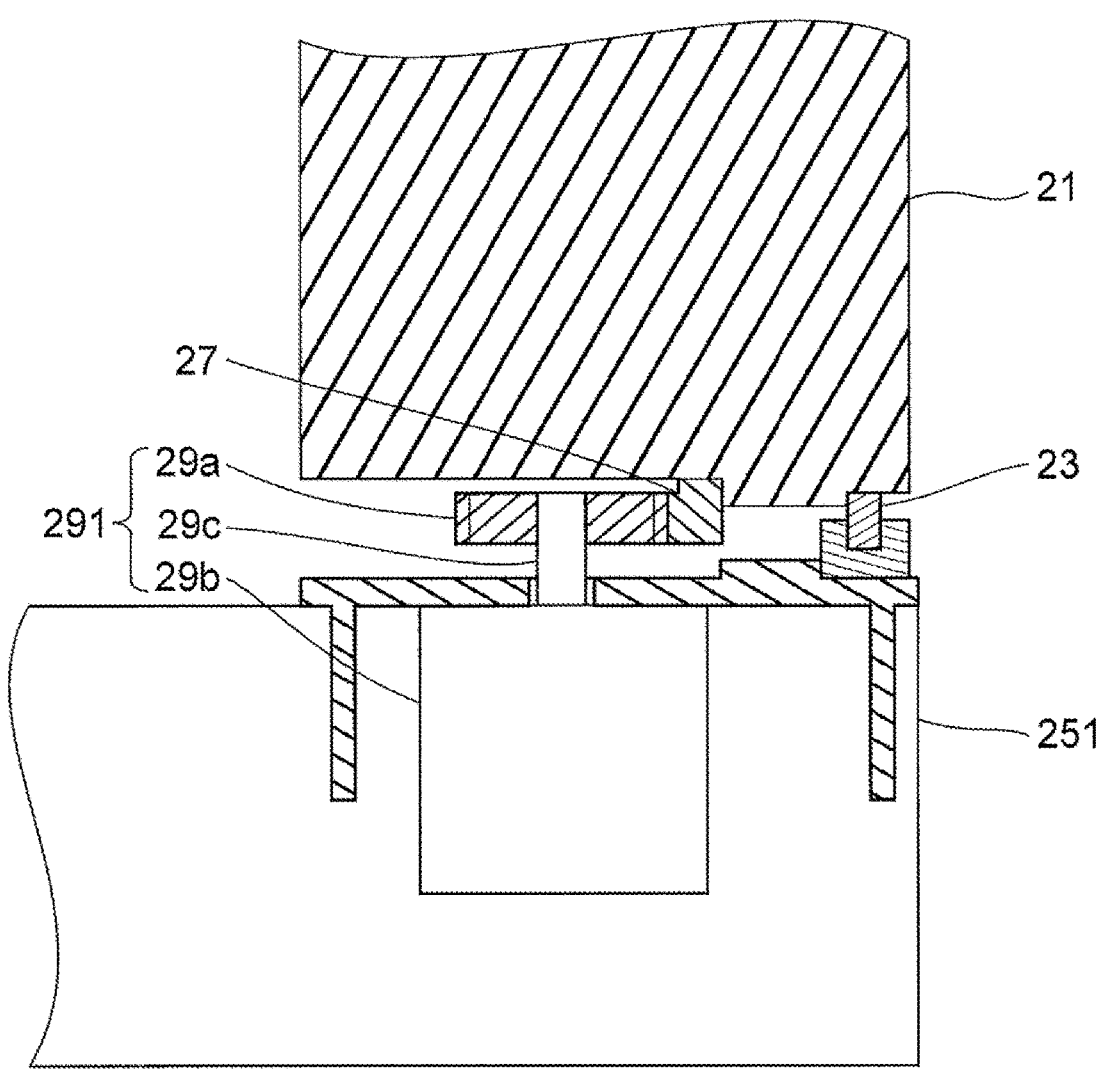
FIG. 4 is a cross-sectional view taken along line IV-IV in FIG. 3.
Figure 4:
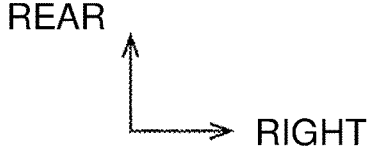

The support column 21 is fixed to the frame 11. As shown in FIGS. 3 and 4, the front vertical guides 23 extend vertically. The front vertical guides 23 are disposed on the support columns 21, respectively. The front vertical guide 23 is, for example, a linear guide. The front beam 251 extends across the pair of front vertical guides 23. The front beam 251 moves up and down.

The front vertical racks 27 extend vertically. The front vertical racks 27 are disposed on the support column 21, respectively. The first front vertical moving side feeding device 291 has a front vertical motor 29b and a front vertical pinion 29a. The front vertical motor 29b is fixed to the first front beams 251. The front vertical motor 29b has an output shaft 29c. The pinion 29a is fixed to the output shaft 29c. The pinion 29a is engaged with the rack 27. The first front vertical moving side feeding device 291 moves vertically integrally with the first front beam 251.

Preferably, the front vertical racks 27 and the first front vertical moving side feeding devices 291 are disposed at both ends of the first front beam 251.

Figure 5:
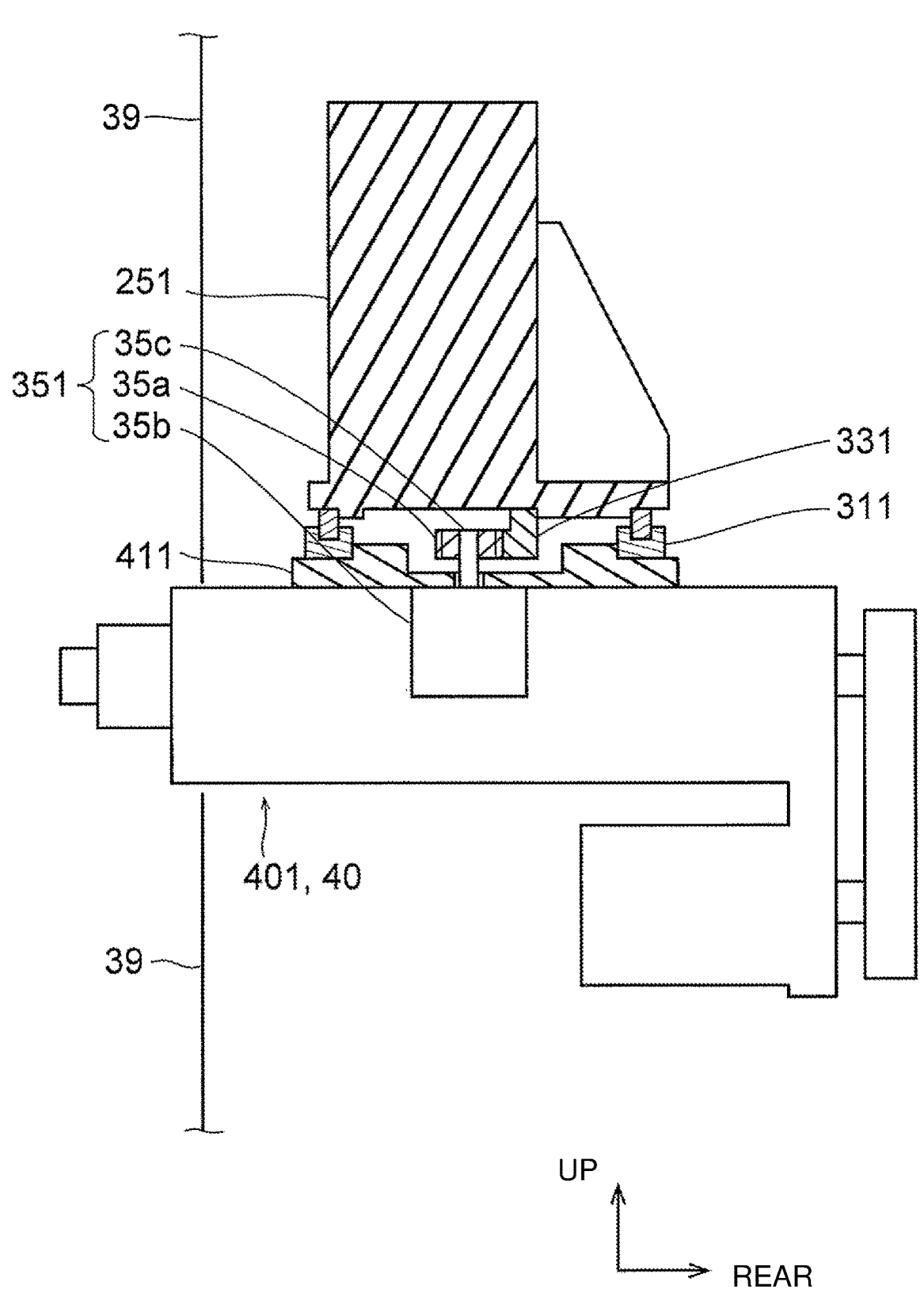
FIG. 5 is a sectional view taken along line V-V in FIG. 3.

As shown in FIGS. 3 and 5, the pair of first front lateral guides 311 extend in a lateral direction. The pair of first front lateral guides 311 are disposed on the lower surface of the first front beam 251 so as to be arranged in a front-rear direction. The first front lateral rack 331 is disposed on the first front beam 251. The first front lateral rack 331 extends in the lateral direction. The first front lateral rack 331 is disposed between the first front lateral guides 311. The first front unit processing machine 401 is disposed on the first front lateral guide 311. The first front unit processing machine 401 moves laterally. The first front unit processing machine 401 is suspended from the first front beam 251.

The first front lateral moving side feeding device 351 is disposed on the right side of the first front unit processing machine 401. The first front lateral moving side feeding device 351 includes a first front lateral motor 35b and a first front lateral pinion 35a. The motor 35b has an output shaft 35c. The motor 35b is disposed on the first front unit body 411. The pinion 35a is coupled to the output shaft 35c. The pinion 35a is engaged with the first front lateral rack 331. The first front lateral moving side feeding device 351 moves integrally with the first front unit processing machine 401.

The second front unit processing machine 402 is substantially the same as the first front unit processing machine 401, and is located on the left side of the first front unit processing machine 401. The second front lateral moving side feeding device 352 is substantially the same as the first front lateral moving side feeding device 351. However, the second front lateral moving side feeding device 352 is disposed on the left side of the second front unit processing machine 402.

The first front cable protection tube 371 includes a first fixed end 37a1 and a first moving end 37b1. The first fixed end 37a1 is disposed rightward from the center of the first front beam 251. The first moving end 37b1 is disposed on the first front unit body 411. The front cable protection tube 371 extends rightward from the first fixed end 37a1 and is folded back in a U-shape to be connected to the first moving end 37b1.

The second front cable protection tube 372 includes a second fixed end 37a2 and a second moving end 37b2. The second front cable protection tube 372 is arranged in plane symmetry with the first front cable protection tube 371 with respect to the center of the first front beam 251.

The second front processing machine group 24 includes a second front beam 252, a second front lateral guide 312, a second front vertical moving side feeding device 292, a third front unit processing machine 403, a fourth front unit processing machine 404, a second front lateral rack (second front lateral fixed side feeding device) 332, a third front lateral moving side feeding device 353, a fourth front lateral moving side feeding device 354, a third front cable protection tube 373, and a fourth front cable protection tube 374.

The second front processing machine group 24 is disposed below the first front processing machine group 22. The second front processing machine group 24 has a structure symmetrical to the first front processing machine group 22 with respect to the horizontal plane.

The front cover 39 is an expansion cover. The front cover 39 covers the front vertical guide 23, the front vertical rack 27, the front vertical moving side feeding devices 291, 292, the front beams 251, 252, the front lateral guides 311, 312, the front lateral racks 331, 332, the front lateral moving side feeding devices 351 to 354, and the front cable protection tubes 371 to 374.

The front vertical rack 27 and the second front processing machine group 24 may be omitted. Further, the first front vertical moving side feeding device 291, the first front lateral rack 331, the second front unit processing machine 402, the first front lateral moving side feeding device 351, the second front lateral moving side feeding device 352, the first front cable protection tube 371, and the second front cable protection tube 372 may be omitted among the first front processing machine group 22.

Figure 6:
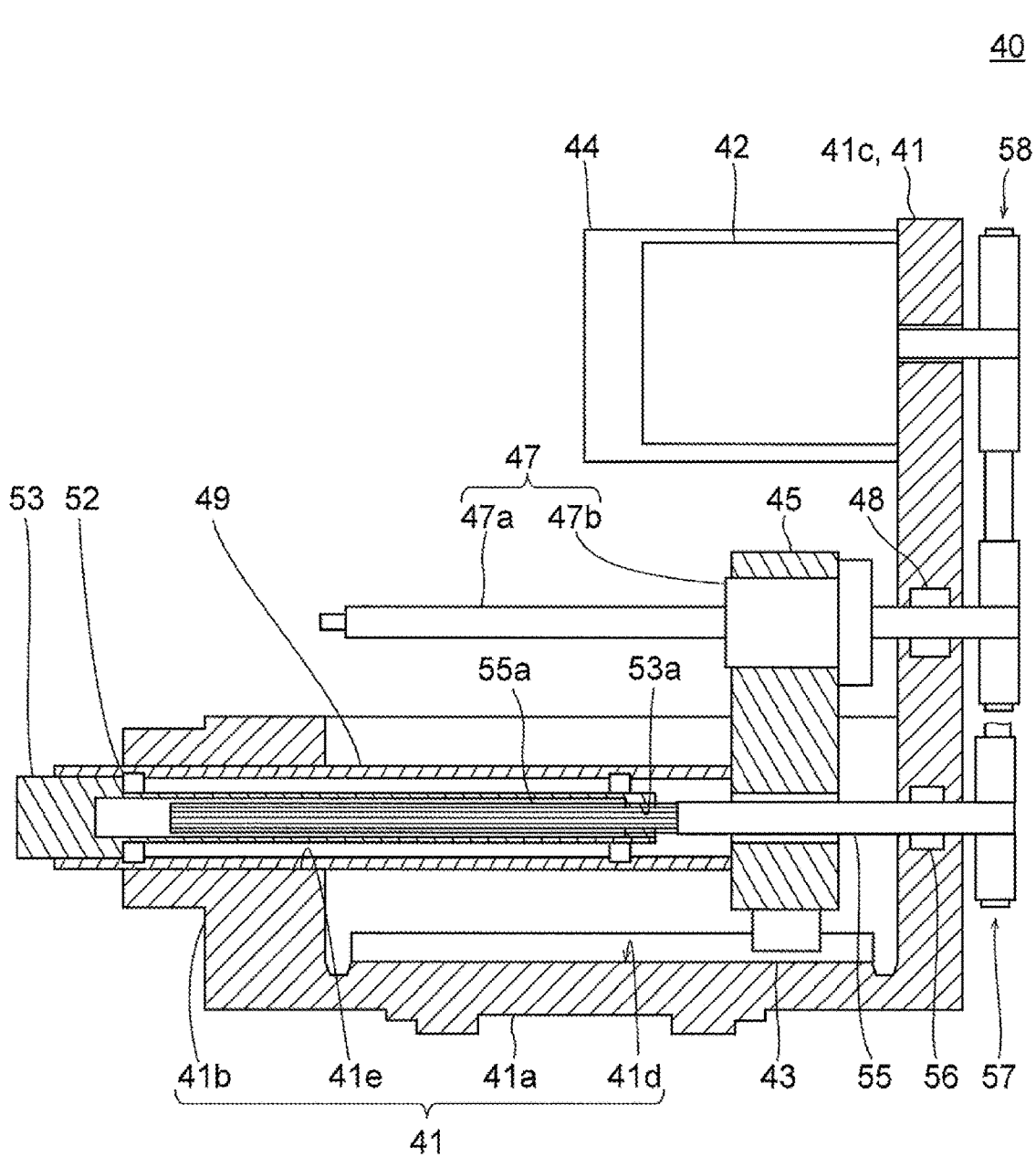
FIG. 6 is a vertical cross-sectional view of a unit processing machine according to the embodiment.

As shown in FIG. 6, the unit processing machine 40 includes a body 41, a feeding guide 43, a feeding block 45, a ram 49, a spindle 53, a drive shaft 55, bearings 52, 56, 48, a feeding screw 47, a first toothed belt mechanism 57, a second toothed belt mechanism 58, a spindle motor 44, and a feeding motor 42.

The unit processing machines 40 are generic term of the front unit processing machines 401 to 404, the top unit processing machines 405, 406, and the side unit processing machines 407, 408. The front unit processing machines 401 to 404, the top unit processing machines 405, 406, and the side unit processing machines 407, 408 each have the same structure as the unit processing machine 40. The body 41 is a generic term of the front unit bodies 411 to 414, the top unit bodies 415, 416, and the side unit bodies 417, 418. The spindle 53 is a generic term of the front spindles 531 to 534, the top spindles 535, 536, and the side spindles 537, 538.

The body 41 has a box shape. The body 41 includes a base plate 41a, a ram support 41b, a guide support surface 41d, a motor support 41c, and a ram guide hole 41e. The base plate 41a is disposed on the guide (for example, first front lateral guide 311). A moving side feeding device (for example, the first front lateral moving side feeding device 351) is disposed on the base plate 41a.

The ram support 41b and the motor support 41c rise from the base plate 41a. The ram guide hole 41e extends along the spindle 53 to be disposed on the ram support 41b. The feeding guide 43 is disposed on the guide support surface 41d along the spindle 53. The feeding block 45 is disposed on the feeding guide 43 to reciprocate along the feeding guide 43.

The ram 49 has a hollow structure. The ram 49 extends through the ram guide hole 41e to be coupled to the feeding block 45. The spindle 53 is supported inside the ram 49 with the bearing 52. The spindle 53, which has a hollow-cylindrical shape, has a spline hole 53a at a proximal end portion (a right end in FIG. 6).

The drive shaft 55 extends through the motor support 41c. The basal end of the drive shaft 55 is supported by the motor support 41c with the bearing 56. The drive shaft 55 has a spline shaft 55a at its distal end (left end in FIG. 6). The spline shaft 55a meshes with the spline hole 53a.

The feeding screw 47 includes a screw shaft 47a and a nut 47b. The basal end of the screw shaft 47a is supported by the motor support 41c with the bearing 48. The nut 47b is fastened to the feeding block 45. The spindle motor 44 and the feeding motor 42 are arranged side by side on the motor support 41c. The spindle motor 44 and the drive shaft 55 are connected by the first toothed belt mechanism 57. The feeding motor 42 and the screw shaft 47a are connected by the second toothed belt mechanism 58.

The drive shaft 55 may be directly connected to the spindle motor 44. The screw shaft 47a may be directly connected to the feeding motor 42. Here, the drive shaft and the spindle motor 44 are connected with a coupling. The screw shaft 47a and the feeding motor 42 are connected with a coupling.

Figure 7:
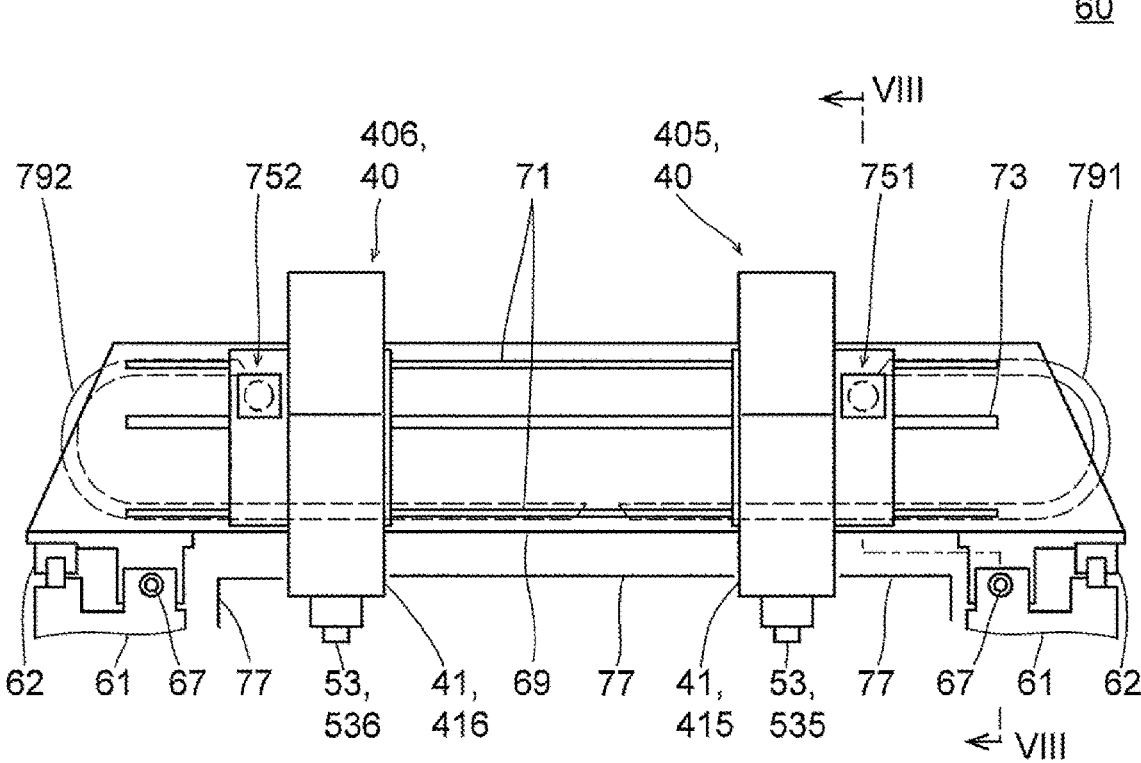
FIG. 7 is a front view of a top processing machine according to the embodiment.
Figure 7:
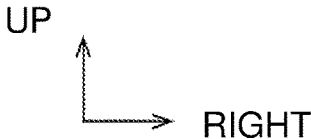
Figure 8:
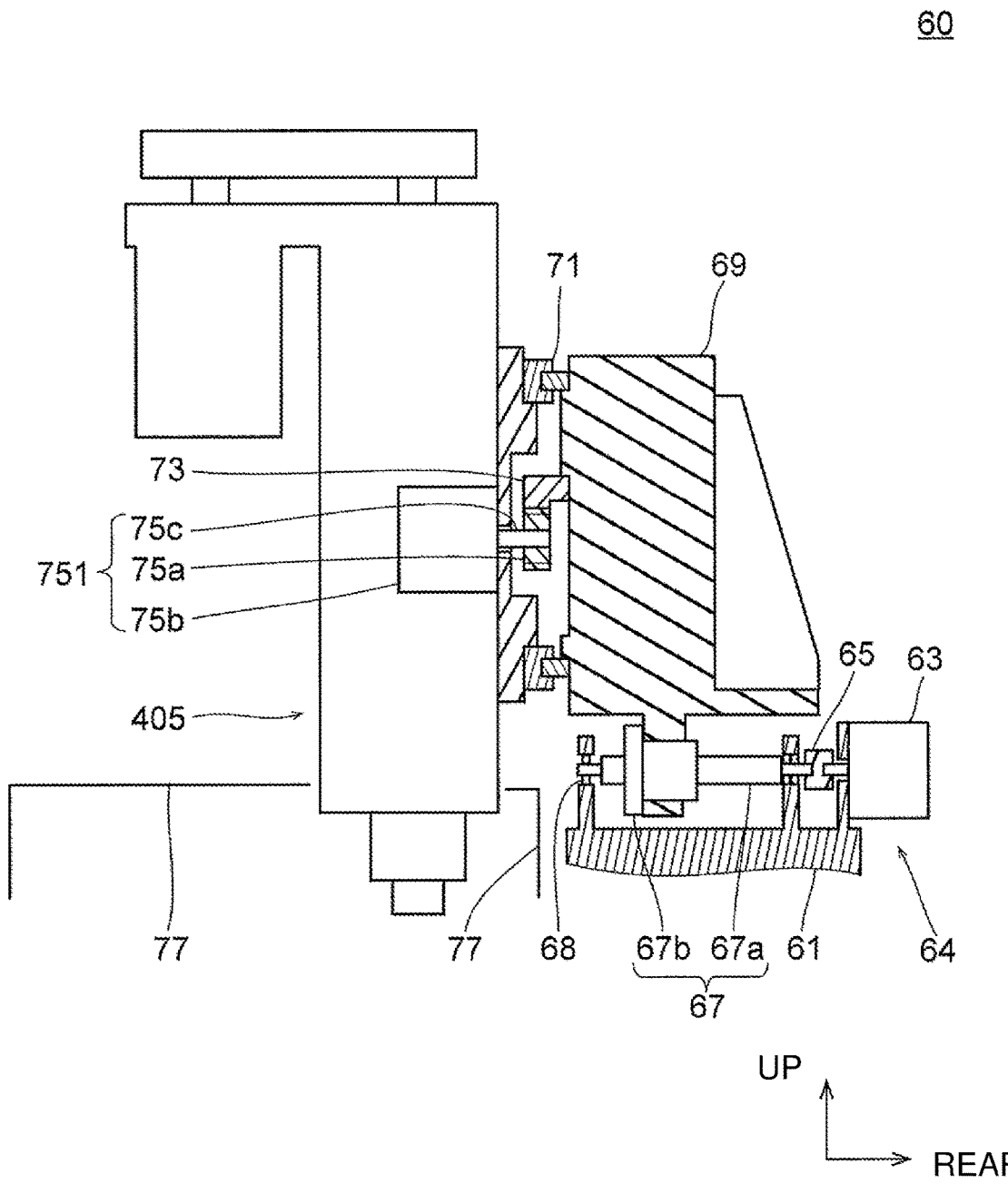
FIG. 8 is a cross-sectional view taken along line VIII-VIII in FIG. 7.

As shown in FIGS. 7 and 8, the top processing machine 60 includes a pair of top front-rear guides 62, a top beam 69, a pair of top lateral guides 71, and a first top unit processing machine 405. The top processing machine 60 may include a front-rear frame 61, a top front-rear feeding device 64, a second top unit processing machine 406, a top rack (top lateral fixed side feeding device) 73, a first top lateral moving side feeding device 751, a second top lateral moving side feeding device 752, a first top cable protection tube 791, and a second top cable protection tube 792.

The front-rear frames 61 are fixed to the frame 11. The top front-rear guides 62 extend in a front-rear direction. The top front-rear guides 62 are disposed on the front-rear frame 61. The top beam 69 extends laterally. The top beam 69 extends over the pair of top front-rear guides 62 to move in a front-rear direction.

As shown in FIG. 8, the top front-rear feeding device 64 extends in the front-rear direction. The top front-rear feeding device 64 is disposed on the front-rear frame 61. The top front-rear feeding device 64 includes a top front-rear motor 63, a feeding screw 67, a coupling 65, and a bearing 68. The feeding screw 67 includes a screw shaft 67a and a nut 67b. The screw shaft 67a is supported by the front-rear frame 61 with the bearing 68. The nut 67b is fastened to the top beam 69. The top front-rear motor 63 is supported by the front-rear frame 61 to be connected to the feeding screw 67 with a coupling 65.

Preferably, the top front-rear feeding devices 64 are disposed at both ends of the top beam 69.

As shown in FIGS. 7 and 8, the pair of top lateral guides 71 are disposed on the top beam 69 in the vertical direction. Each of the top lateral guides 71 extends laterally. For example, the top lateral guides 71 are disposed on a front surface of the top beam 69. The first top unit processing machine 405 is disposed on the top lateral guide 71 to move laterally. The top lateral rack 73 is disposed on the top beam 69. The top lateral rack 73 extends laterally. The top lateral rack 73 is disposed between the pair of top lateral guides 71.

The first top lateral moving side feeding device 751 includes a top lateral motor 75b and a top lateral pinion 75a. The top lateral motor 75b has an output shaft 75c. The top lateral motor 75b is disposed on the first top unit body 415. The top lateral pinion 75a is coupled to the output shaft 75c to be engaged with the top lateral rack 73. The first top lateral moving side feeding device 751 is disposed on the right side of the first top unit processing machine 405. The first top lateral moving side feeding device 751 moves integrally with the first top unit processing machine 405.

The second top unit processing machine 406 is disposed on the left side of the first top unit processing machine 405 and on the top lateral guides 71. The second top lateral moving side feeding device 752 is substantially the same as the first top lateral moving side feeding device 751, and is disposed on the left side of the second top unit processing machine 406.

The first top cable protection tube 791 is substantially the same as the first front cable protection tube 371. The second top cable protection tube 792 is substantially the same as the second front cable protection tube 372.

The top cover 77 is an expansion cover. The top cover 77 separates the top front-rear feeding device 64, the top front-rear guide 62, the top beam 69, the top lateral guide 71, the top lateral rack 73, the top lateral moving side feeding devices 751, 752, and the top cable protection tubes 791, 792 from the workpiece attachment surface 15a.

Figure 9:
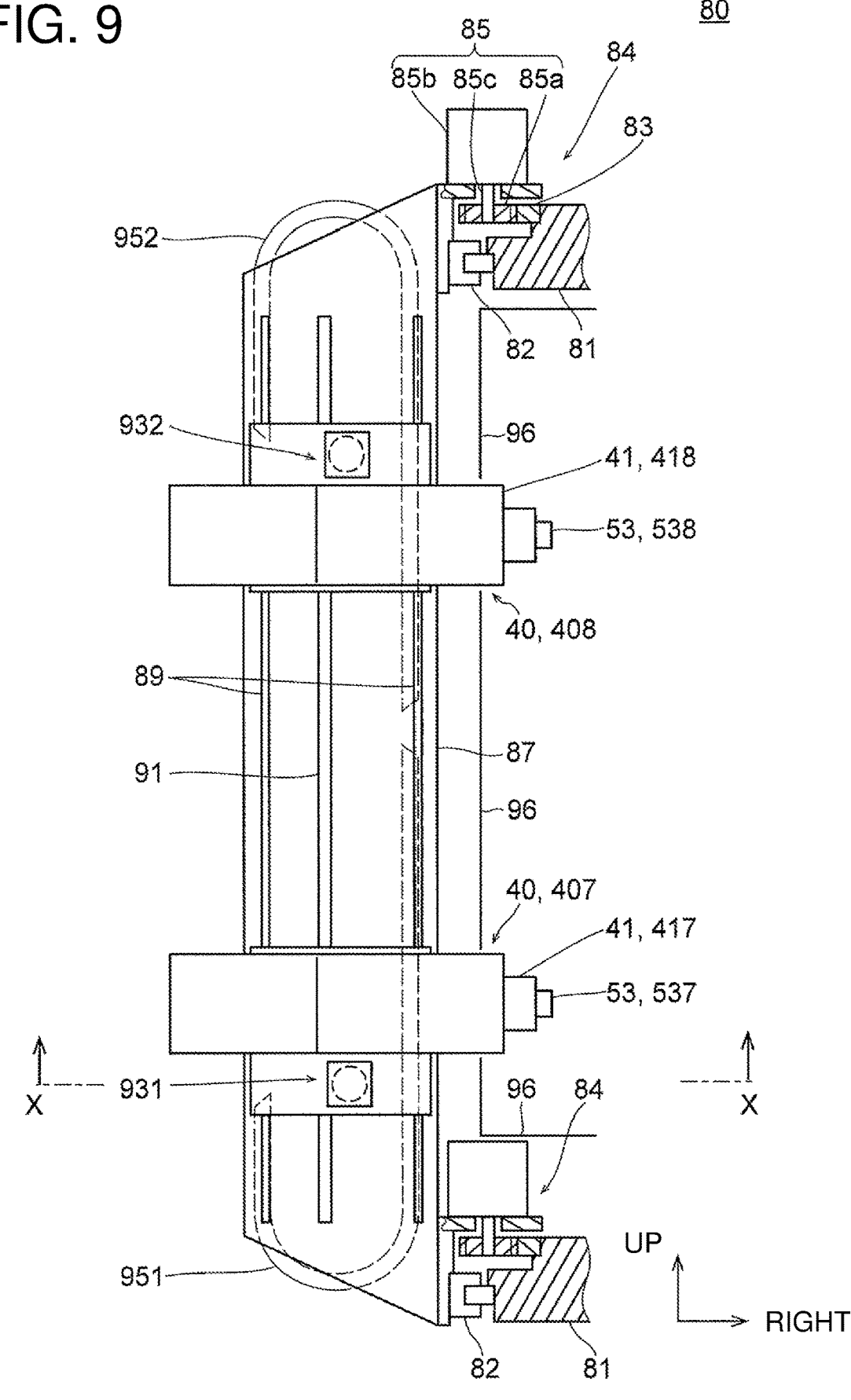
FIG. 9 is a front view of a side processing machine according to the embodiment.
Figure 10:
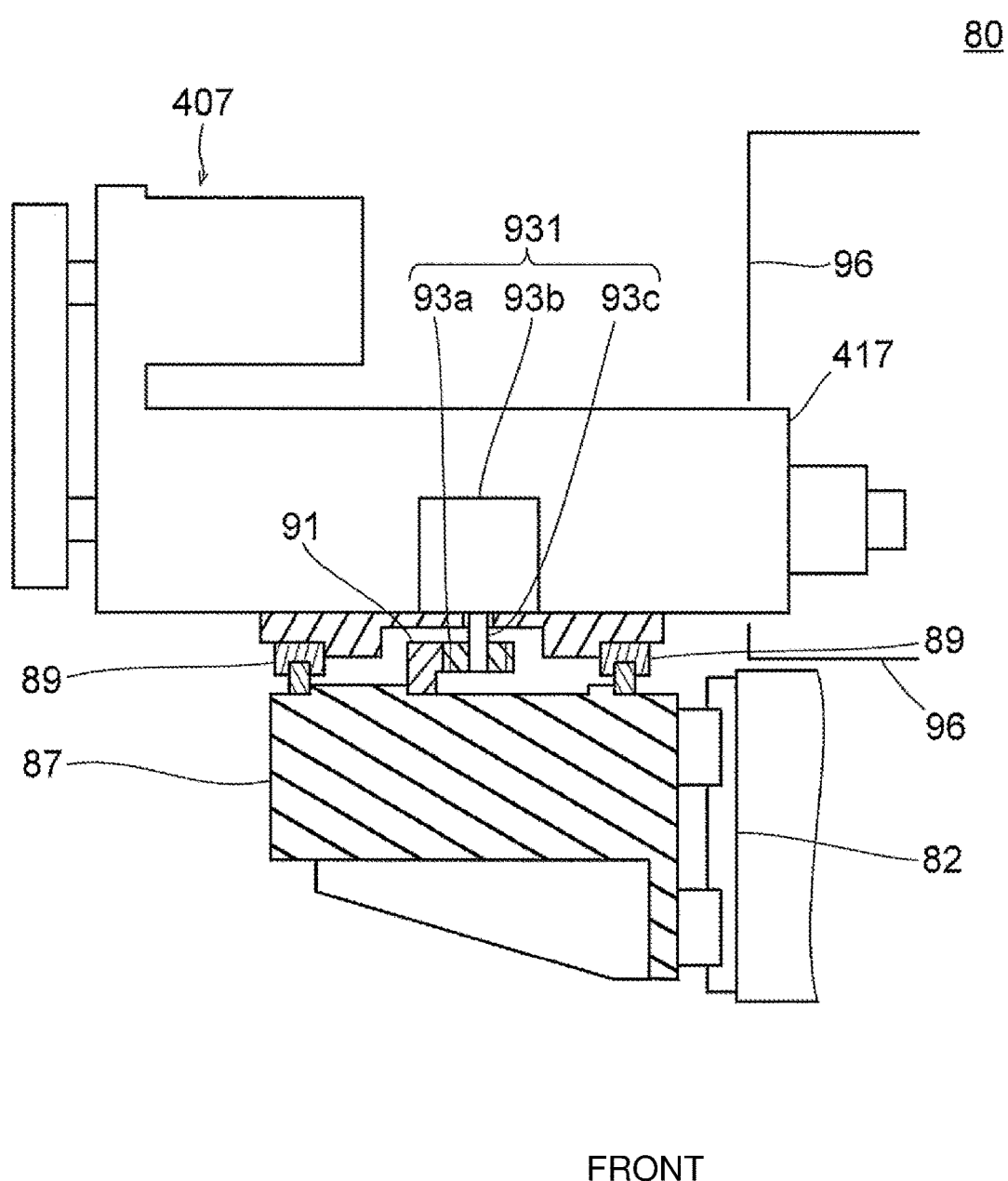
FIG. 10 is a cross-sectional view taken along line X-X inf FIG. 9.

FIG. 9 and FIG. 10 show the side processing machine 806. As shown in FIGS. 9 and 10, the side processing machine 80 includes a pair of side front-rear guides 82, a moving column 87, a pair of side vertical guides 89, and a first side unit processing machine 407. The side processing machine 80 may include a pair of side beams 81, a side front-rear feeding device 84, a side vertical rack (side vertical fixed side feeding device) 91, a first side vertical moving side feeding device 931, a second side unit processing machine 408, a second side vertical moving side feeding device 932, a first side cable protection tube 951, and a second side cable protection tube 952.

In FIG. 9 and FIG. 10, the side processing machine 804 has a symmetrical structure with the side processing machine 806.

The side beam 81 is fixed to the frame 11. The pair of side front-rear guides 82 are disposed on the side beam 81. Each side front-rear guides 82 extends in the front-rear direction. The moving column 87 extends vertically. The moving column 87, which is disposed on the side front-rear guides 82, moves in the front-rear direction.

The side front-rear feeding device 84 includes a side front-rear rack (side front-rear fixed side feeding device) 83 and a side front-rear moving side feeding device 85. The side front-rear rack 83 is disposed on the side beam 81. The side front-rear moving side feeding device 85 includes a side front-rear pinion 85a and a side front-rear motor 85b. The side front-rear motor 85b includes an output shaft 85c. The side front-rear motor 85b is disposed on the moving column 87. The side front-rear pinion 85a is fastened to the output shaft 85c to be engaged with the side front-rear rack 83.

Preferably, the side front-rear guide 82 and the side front-rear feeding device 84 are disposed at both ends of the moving column 87.

The side vertical guides 89 extend vertically. The side vertical guides 89 are disposed on the moving column 87. The first side unit processing machine 407 is disposed on the side vertical guides 89 to move vertically. The side vertical rack 91 extends vertically. The side vertical rack 91 is disposed on the moving column 87. Preferably, the side vertical rack 91 is disposed in the middle of the pair of side vertical guides 89.

The first side vertical moving side feeding device 931 includes a side vertical pinion 93a and a side vertical motor 93b. The side vertical motor 93b includes an output shaft 93c. The side vertical motor 93b is disposed on the first side unit body 417. The side vertical pinion 93a is coupled to the output shaft 93c to be engaged with the side vertical rack 91. The first side vertical moving side feeding device 931 is disposed below the first side unit processing machine 407. The first side vertical moving side feeding device 931 moves integrally with the first side unit processing machine 407.

The second side unit processing machine 408 is disposed above the first side unit processing machine 407. The second side vertical moving side feeding device 932, which is substantially the same as the first side vertical moving side feeding device 931, is disposed above the second side unit processing machine 408.

The first side cable protection tube 951 is substantially the same as the first front cable protection tube 371. The second side cable protection tube 952 is substantially the same as the second front cable protection tube 372.

The side cover 96 is an expansion cover. The side cover 96 separates the side front-rear guides 82, the side front-rear feeding device 84, the moving column 87, the side vertical guides 89, the side vertical rack 91, and the side vertical moving side feeding devices 931, 932 from the workpiece attachment surface 15a.

The front processing machine 20, the top processing machine 60, and the side processing machine 80 may include an automatic tool changer (not shown).

The operation of the indexing processing machine 10 will be described with reference to FIG. 2.

First, at the index position 3, the processed workpiece 2 is removed and the unprocessed workpiece 2 is attached.

Next, the index table 13 is rotated by 90 degrees, and the front surface 2a of the workpiece 2 is processed by the front processing machine 204, the top surface 2b is processed by the top processing machine 604, and the left side surface 2d is processed by the side processing machine 804 at the index position 4.

Next, the index table 13 is rotated by 90 degrees, and the front surface 2a processed by the front processing machine 204 is further processed by the front processing machine 205 at the index position 5.

Next, the index table 13 is rotated by 90 degrees, and the front surface 2a processed by the front processing machine 205 is further processed by the front processing machine 206 at the index position 6. Further, the top surface 2b processed by the top processing machine 604 is further processed by the top processing machine 606. Further, the right side surface 2c is processed by the side processing machine 806.

Then, the index table 13 is rotated by 90 degrees to return to the index position 3.

When the plurality of workpieces 2 are attached to the jig block 15, the attachment and removal of the workpiece 2 at the index position 3, the processing of the workpiece 2 at the index position 4, the processing of the workpiece 2 at the index position 5, and the processing of the workpiece 2 at the index position 6 are performed simultaneously. After the work at each index position is completed, the index table 13 is rotated. The operation of one cycle of the indexing processing machine 10 includes the attachment and removal of the workpiece 2 at the index position 3, the processing of the workpiece 2 at the index position 4, the processing of the workpiece 2 at the index position 5, the processing of the workpiece 2 at the index position 6, and the rotation of the index table 13. The operation time of one cycle is called a cycle time.

Each time one cycle of operation, each workpiece 2 is processed by moving to the index positions 4, 5, and 6 in this order. The workpiece 2 attached to the index position 3 returns to the index position 3 when operated for four cycles, and is removed from the indexing processing machine 10 in the next cycle.

Each of the unit processing machines 401 to 408 of the indexing processing machine 10 according to the present embodiment is movable freely in the lateral direction and in the front-rear direction with respect to the spindle 531 to 538. In addition, each spindle 531 to 538 is movable freely in the axial direction. Thus, the unit processing machines

401 to 408 can not only perform hole machining but also perform surface machining and groove machining.

The indexing processing machine 10 according to the present embodiment can simultaneously perform the processing at the multiple index positions 3 to 6 by the multiple unit processing machines 40. By allocating the machining at each index position, the cycle time of the machine can be shortened. Thus, the indexing processing machine 10 can freely process the workpieces 2 having the different surface position or different hole positions. Further, combining two or more of the front processing machine 20, the top processing machine 60, and the side processing machine 80 allows processing a plurality of surfaces of the workpiece 2 simultaneously to reduce the number of times of change of the posture of the workpiece 2.

As the workpiece 2 is attached to the side surface of the jig block 15, the installation area of the indexing processing machine 10 can be reduced. In particular, when the workpiece 2 is in the form of a plate, each processing station requires at least twice the area of the workpiece according to the processing machine of Patent Literature 1. In the indexing processing machine 10 according to the present embodiment, as the workpiece 2 is mounted upright, it is possible to set the installation area of the area of the circle having a radius of the length obtained by adding the length of the unit processing machine 40 to the rotation radius of the index table 13.

The first front lateral moving side feeding device 351, the first front unit processing machine 401, the second front unit processing machine 402, and the second front lateral moving side feeding device 352 are arranged in this order. The first front lateral moving side feeding device 351 and the second front lateral moving side feeding device 352 are not disposed between the two front unit processing machines 401 and 402. This allows the two front unit processing machines 401, 402 to be brought into close proximity in the lateral direction.

The front unit processing machines 403, 404 are also substantially the same as the front unit processing machines 401, 402. The top unit processing machines 405, 406 are also substantially the same as the front unit processing machines 401, 402. The side unit processing machines 407, 408 are also substantially the same as the front unit processing machines 401, 402.

The first front beam 251, the front unit processing machines 401, 402, the front unit processing machines 403, 404, and the second front beam 252 are arranged in this order. The first front beam 251 and the second front beam 252 are not located between the front unit processing machines 401, 402 and the front unit processing machines 403, 404. This allows the upper front unit processing machines 401, 402 and the lower front unit processing machines 403, 404 to be close to each other.

The front unit processing machines 401 to 404, the top unit processing machines 405, 406, and the side unit processing machines 407, 408 have the same structure. This allows to standardize the spare parts of the unit processing machine 40. The spare parts of the unit processing machine 40 is replaceable with any of the unit processing machines 401 to 408. This reduces the maintenance cost.

The present invention is not limited to the above-described embodiments, and various modifications can be made without departing from the gist of the present invention, and all technical matters included in the technical idea described in the claims are the subject of the present invention. While the above embodiments have been shown by way of example, those skilled in the art will recognize that various alternatives, modifications, variations, and improvements can be made from the disclosure herein, which fall within the scope of the appended claims.

REFERENCE SIGNS LIST

1 Rotation center
2 Workpiece
3, 4, 5, 6 Index position
10 Indexing processing machine
13 Index table
20, 204, 205, 206 Front processing machine
23 Front vertical guide
251, 252 Front beam
311, 312 Front lateral guide
40 Unit processing machine
401, 402, 403, 404 Front unit processing machine
405, 406 Top unit processing machine
407, 408 Side unit processing machine
41 Body
411, 412, 413, 414 Front unit body
415, 416 Top unit body
417, 418 Side unit body
53 Spindle
531, 532, 533, 534 Front spindle
535, 536 Top spindle
537, 538 Side spindle
60, 604, 606 Top processing machine
62 Top front-rear guide
69 Top beam
71 Top lateral guide
80, 804, 806 Side processing machine
82 Side front-rear guide
87 Moving column
89 Side vertical guide

What is claimed is:

1. An indexing processing machine, comprising:
an index table having a rotation center, a workpiece being attachable to the index table at multiple index positions; and
one or more processing machines selected from a group of a front processing machine, a top processing machine, and a side processing machine, the one or more processing machines disposed at least two of the multiple index positions,
the front processing machine disposed at a front as viewed from the rotation center toward the multiple index positions, the front processing machine including,
a left and right pair of front vertical guides,
a first front beam disposed between the pair of the front vertical guides in a vertically movable manner,
a pair of first front lateral guides disposed on the first front beam, and
a first front unit processing machine including,
a first front unit body disposed on the pair of the first front lateral guides in a laterally movable manner, and
a first front spindle to which a tip tool is attachable, the first front spindle disposed on the first front unit body in an axially reciprocable manner,
the top processing machine disposed above the workpiece as viewed from the rotation center toward the multiple index positions, the top processing machine including,
a left and right pair of top front-rear guides extending in a front-rear direction, a top beam extending across the pair of the top front-rear guides in a movable manner in the front-rear direction,
a pair of top lateral guides disposed on the top beam, and
a first top unit processing machine including,
a first top unit body disposed on the top lateral guide in a laterally movable manner, and
a first top spindle to which the tip tool is attachable, the first top spindle disposed on the first top unit body in an axially reciprocable manner,
the side processing machine disposed at a side of the workpiece as viewed from the rotation center toward the multiple index positions, the side processing machine including,
an upper and lower pair of side front-rear guides extending in the front-rear direction,
a moving column having both ends supported with the pair of the side front-rear guides in a movable manner in the front-rear direction,
a pair of side vertical guides disposed on the moving column, and
a first side unit processing machine including,
a first side unit body disposed on the pair of the side vertical guides in a vertically movable manner, and
a first side spindle to which the tip tool is attachable, the first side spindle disposed on the first side unit body in an axially reciprocable manner.

2. The indexing processing machine according to claim 1, wherein the front processing machine includes
a second front unit processing machine disposed leftward of the first front unit processing machine, the second front unit processing machine including,
a second front unit body disposed on the pair of the first front lateral guides in a laterally movable manner, and
a second front spindle to which a tip tool is attachable, the second front spindle disposed on the second front unit body in an axially reciprocable manner.

3. The indexing processing machine according to claim 2, wherein the front processing machine includes
a first front lateral fixed side feeding device disposed on the first front beam,
a first front lateral moving side feeding device disposed on the first front unit body, the first front lateral moving side feeding device configured to move integrally with the first front unit processing machine in association with the first front lateral fixed side feeding device, and
a second front lateral moving side feeding device disposed on the second front unit body, the second front lateral moving side feeding device configured to move integrally with the second front unit processing machine in association with the first front lateral fixed side feeding device.

4. The indexing processing machine according to claim 1, wherein the front processing machine includes
a second front beam disposed between the pair of the front vertical guides and below the first front beam in a vertically movable manner,
a pair of second front lateral guides disposed on the second front beam, and
a third front unit processing machine including,
a third front unit body disposed on the pair of the second front lateral guides in a laterally movable manner, and a third front spindle to which a tip tool is attachable, the third front spindle disposed on the third front unit body in an axially reciprocable manner.

5. The indexing processing machine according to claim 4, wherein the front processing machine includes a fourth front unit processing machine disposed leftward of the third front unit processing machine, the fourth front unit processing machine including a fourth front unit body disposed on the pair of the second front lateral guides in a laterally movable manner, and a fourth front spindle to which a tip tool is attachable, the fourth front spindle disposed on the fourth front unit body in an axially reciprocable manner.

6. The indexing processing machine according to claim 5, wherein the front processing machine includes a second front lateral fixed side feeding device disposed on the second front beam, a third front lateral moving side feeding device disposed on the third front unit body, the third front lateral moving side feeding device configured to move integrally with the third front unit processing machine in association with the second front lateral fixed side feeding device, and a fourth front lateral moving side feeding device disposed on the fourth front unit body, the fourth front lateral moving side feeding device configured to move integrally with the fourth front unit processing machine in association with the second front lateral fixed side feeding device.

7. The indexing processing machine according to claim 1, wherein the first front unit processing machine is disposed below the first front beam.

8. The indexing processing machine according to claim 6, wherein the third front unit processing machine is disposed above the second front beam.

9. The indexing processing machine according to claim 1, wherein the top processing machine includes a second top unit processing machine disposed on the left of the first top unit processing machine, the second top unit processing machine including, a second top unit body disposed on the top lateral guide in a laterally movable manner, and a second top spindle to which the tip tool is attachable, the second top spindle disposed on the second top unit body in an axially reciprocable manner.

10. The indexing processing machine according to claim 9, wherein the top processing machine includes a top lateral fixed side feeding device disposed on the top beam, a first top lateral moving side feeding device disposed on the first top unit-body body, the first top lateral moving side feeding device configured to move integrally with the first top unit processing machine in association with the top lateral fixed side feeding device, and a second top lateral moving side feeding device disposed on the second top unit body, the second top lateral moving side feeding device configured to move integrally with the second top unit processing machine in association with the top lateral fixed side feeding device.

11. The indexing processing machine according to claim 1, wherein the side processing machine includes a second side unit processing machine disposed above the first side unit processing-machine, second side unit processing machine including, a second side unit body disposed on the pair of the side vertical guides in a vertically movable manner, and a second side spindle to which the tip tool is attachable, the second side spindle disposed on the second side unit body in an axially reciprocable manner.

12. The indexing processing machine according to claim 11, wherein the side processing machine includes a side vertical fixed side feeding device disposed on the moving-column column, a first side vertical moving side feeding device disposed on the first side unit body, the first side vertical moving side feeding device configured to move integrally with the first side unit processing machine in association with the side vertical fixed side feeding device, and a second side vertical moving side feeding device disposed on the second side unit body, the second side vertical moving side feeding device configured to move integrally with the second side unit processing machine in association with the side vertical fixed side feeding device.

13. The indexing processing machine according to claim 2, wherein the front processing machine includes a second front beam disposed between the pair of the front vertical guides and below the first front beam in a vertically movable manner, a pair of second front lateral guides disposed on the second front beam, and a third front unit processing machine including, a third front unit body disposed on the pair of the second front lateral guides in a laterally movable manner, and a third front spindle to which a tip tool is attachable, the third front spindle disposed on the third front unit body in an axially reciprocable manner.

14. The indexing processing machine according to claim 3, wherein the front processing machine includes a second front beam disposed between the pair of the front vertical guides and below the first front beam in a vertically movable manner, a pair of second front lateral guides disposed on the second front beam, and a third front unit processing machine including, a third front unit body disposed on the pair of the second front lateral guides in a laterally movable manner, and a third front spindle to which a tip tool is attachable, the third front spindle disposed on the third front unit body in an axially reciprocable manner.

15. The indexing processing machine according to claim 2, wherein the first front unit processing machine is disposed below the first front beam.

16. The indexing processing machine according to claim 3, wherein the first front unit processing machine is disposed below the first front beam.

17. The indexing processing machine according to claim 4, wherein the first front unit processing machine is disposed below the first front beam.

18. The indexing processing machine according to claim 5, wherein the first front unit processing machine is disposed below the first front beam.

19. The indexing processing machine according to claim 6, wherein the first front unit processing machine is disposed below the first front beam.

20. The indexing processing machine according to claim 2, wherein the top processing machine includes a second top unit processing machine disposed on the left of the first top unit processing machine, the second top unit processing machine including, a second top unit body disposed on the top lateral guide in a laterally movable manner, and a second top spindle to which the tip tool is attachable, the second top spindle disposed on the second top unit body in an axially reciprocable manner.

* * * * *